United States Patent
Koo et al.

(10) Patent No.: US 7,492,096 B2
(45) Date of Patent: Feb. 17, 2009

(54) FLAT PANEL DISPLAY DEVICE CAPABLE OF REDUCING OR PREVENTING A VOLTAGE DROP AND METHOD OF FABRICATING THE SAME

(75) Inventors: Jae-Bon Koo, Yongin-si (KR); Ul-Ho Lee, Yongin-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 285 days.

(21) Appl. No.: 10/924,890

(22) Filed: Aug. 25, 2004

(65) Prior Publication Data

US 2005/0077814 A1  Apr. 14, 2005

(30) Foreign Application Priority Data

Oct. 9, 2003  (KR) .................. 10-2003-0070338

(51) Int. Cl.
*H05B 33/00* (2006.01)
*H05B 33/14* (2006.01)

(52) U.S. Cl. .................. 313/506; 313/504; 428/690; 428/917; 445/24; 315/169.3

(58) Field of Classification Search .................. 313/506
See application file for complete search history.

(56) References Cited

U.S. PATENT DOCUMENTS

| | | | |
|---|---|---|---|
| 6,538,374 B2* | 3/2003 | Hosokawa | 313/504 |
| 6,541,130 B2* | 4/2003 | Fukuda | 428/690 |
| 2002/0033664 A1* | 3/2002 | Kobayashi | 313/504 |
| 2002/0158835 A1* | 10/2002 | Kobayashi et al. | 345/100 |
| 2002/0190924 A1* | 12/2002 | Asano et al. | 345/55 |
| 2003/0137325 A1 | 7/2003 | Yamazaki et al. | |
| 2003/0193056 A1* | 10/2003 | Takayama et al. | 257/79 |
| 2003/0201716 A1* | 10/2003 | Yamazaki et al. | 313/506 |
| 2003/0218419 A1* | 11/2003 | Bae | 313/504 |
| 2004/0217704 A1* | 11/2004 | Iwase et al. | 313/518 |
| 2005/0007015 A1* | 1/2005 | Yokoyama et al. | 313/506 |

(Continued)

FOREIGN PATENT DOCUMENTS

CN   1363201   8/2002

(Continued)

OTHER PUBLICATIONS

Chinese Office Action dated Dec. 21, 2007.

*Primary Examiner*—Sikha Roy
(74) *Attorney, Agent, or Firm*—H.C. Park & Associates, PLC

(57) ABSTRACT

A top-emitting organic light-emitting device can prevent a voltage drop by electrically coupling a cathode bus line to a cathode electrode. A method for fabricating the same is also disclosed. The flat panel display device comprises an insulating substrate having a pixel region and a non-pixel region, a first electrode arranged in the pixel region a second electrode arranged in the pixel region and the non-pixel region, an organic emission layer and a charge transporting layer formed between the first electrode and the second electrode of the pixel region, and an electrode line formed in the pixel region and the non-pixel region. The electrode line and the second electrode are electrically and directly coupled to each other in the non-pixel region.

17 Claims, 4 Drawing Sheets

U.S. PATENT DOCUMENTS

2005/0057151 A1 * 3/2005 Kuwabara ................... 313/506

FOREIGN PATENT DOCUMENTS

| | | |
|---|---|---|
| EP | 1349208 | 10/2003 |
| JP | 2002-318553 | 10/2002 |
| JP | 2003-123988 | 4/2003 |
| JP | 2003-168570 | 6/2003 |
| JP | 2005-019211 | 1/2005 |
| JP | 2005-038833 | 2/2005 |
| KR | 10-2004-0025383 | 3/2003 |
| KR | 10-2003-0064303 | 7/2003 |
| WO | 01-63975 | 8/2001 |
| WO | 03-060858 | 7/2003 |

* cited by examiner

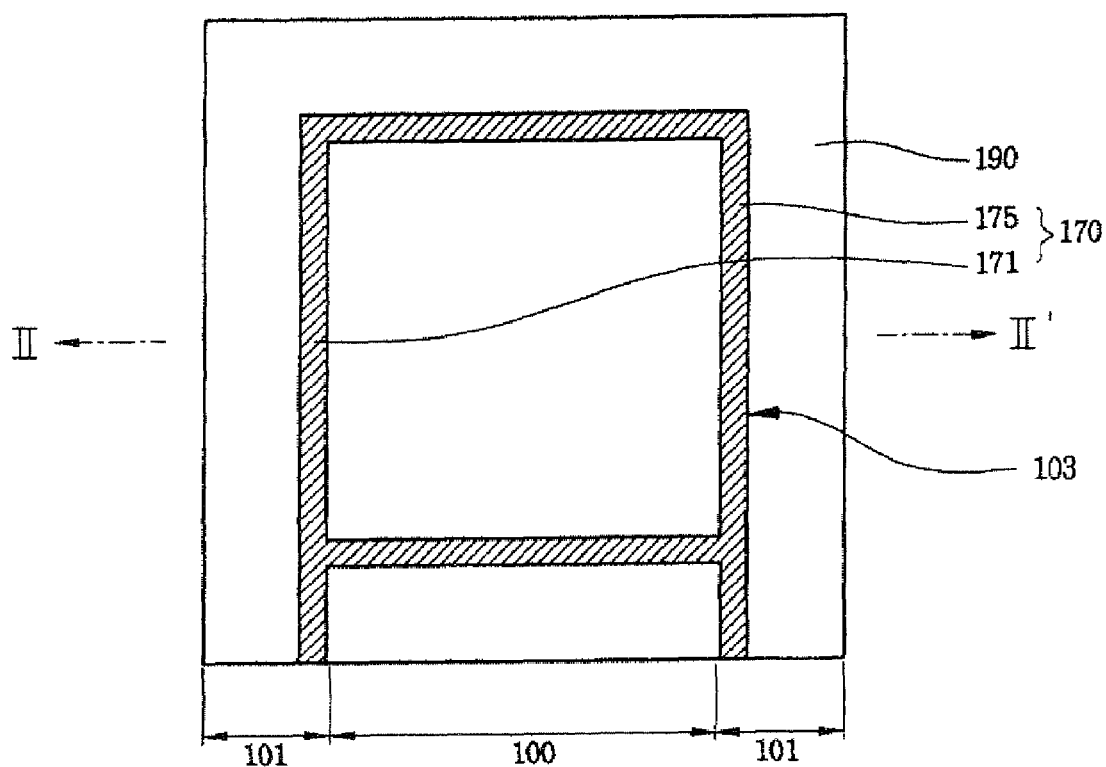
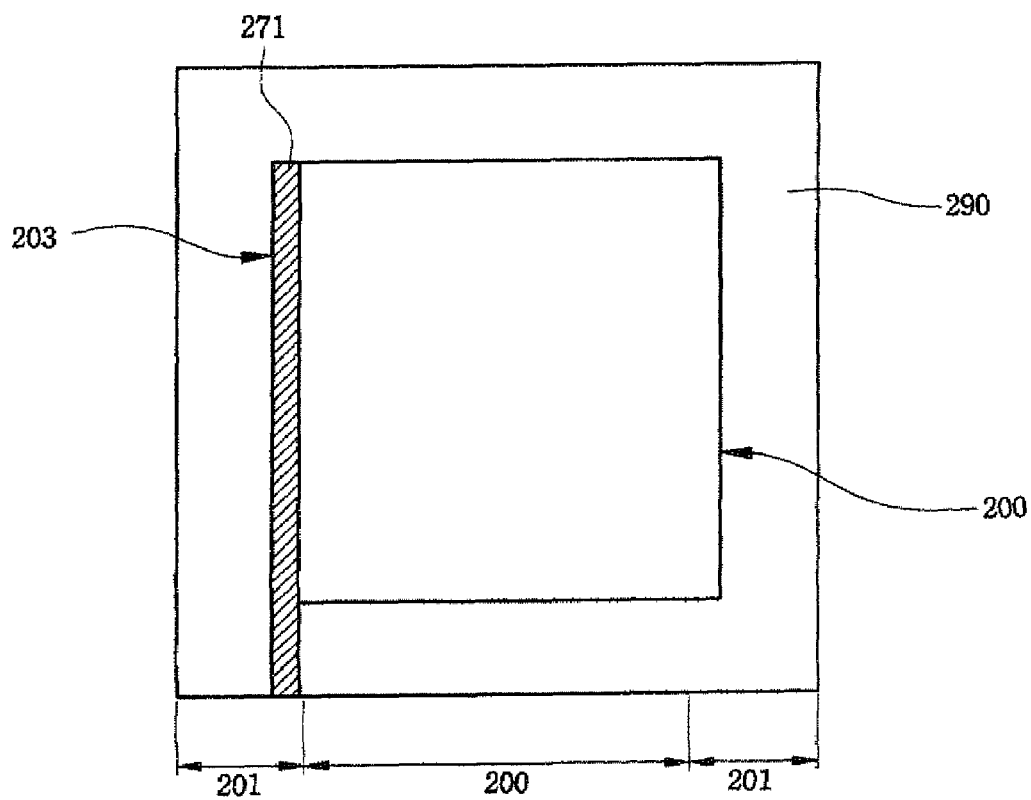

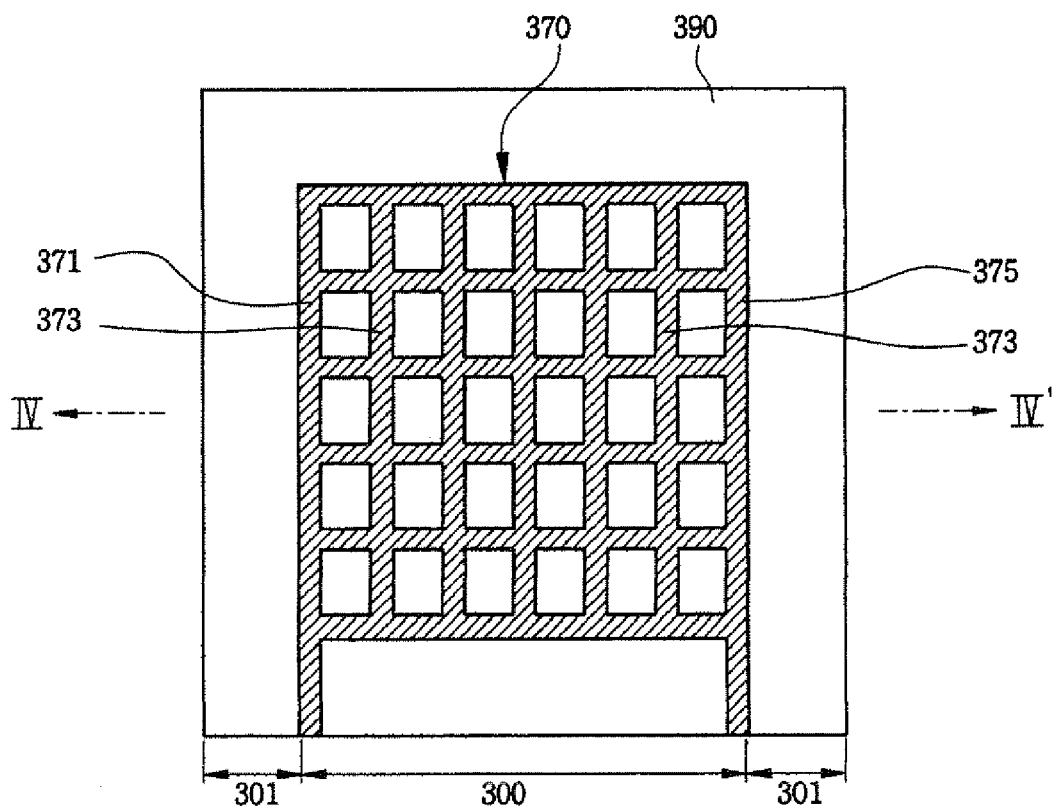
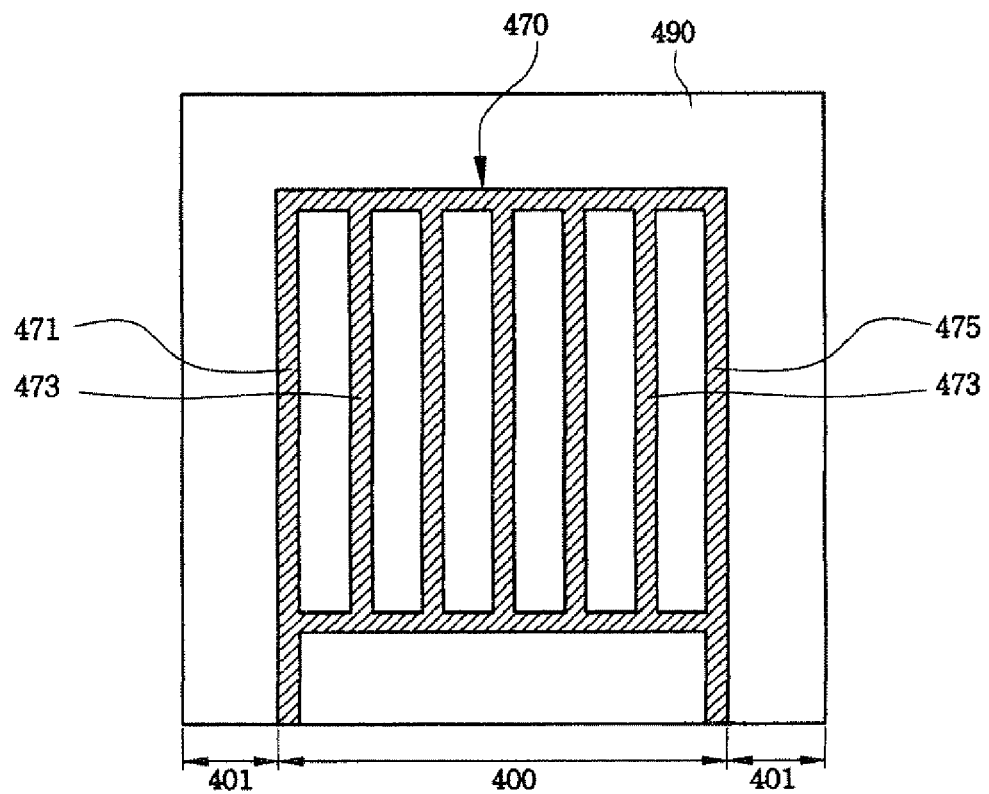

FLAT PANEL DISPLAY DEVICE CAPABLE OF REDUCING OR PREVENTING A VOLTAGE DROP AND METHOD OF FABRICATING THE SAME

CROSS-REFERENCE TO RELATED APPLICATION

This application claims the benefit of Korea Patent Application No. 2003-70338 filed on Oct. 9, 2003, the disclosure of which is incorporated herein by reference in its entirety.

BACKGROUND OF THE INVENTION

1. Field of the Invention

The present invention relates to an active matrix type flat panel display device and, more particularly, to a top-emitting organic light-emitting device (OLED) capable of reducing or preventing a voltage drop, with a cathode bus line and a cathode electrode being electrically coupled and method for fabricating the same.

2. Description of Background

In general, an organic light emitting device is an emissive display device which may be classified into a bottom-emitting structure type and a top-emitting structure type based on the direction of light emitted from an organic emission layer. The top-emitting organic light-emitting device emits light in a direction opposite to a substrate where pixels are arranged, and may increase an aperture ratio when compared to the bottom-emitting structure which emits light toward the substrate where the pixels are arranged.

The light is emitted toward the substrate for encapsulation in the top-emitting structure, so that a transparent electrode is used for a cathode electrode. A transparent conductive layer, such as ITO or IZO, is used for the transparent electrode. However, the transparent conductive layer may have a higher work function, so that it is difficult to use it for the cathode electrode.

To cope with this problem, a thin metal having a lower work function is deposited on an organic emission layer for the cathode electrode to form a semitransparent metal layer. A thick transparent conductive layer is then deposited on the semitransparent metal layer to form a transparent electrode having a stacked structure.

However, in the cathode electrode of the stacked structure, since the transparent conductive layer, such as ITO or IZO, is deposited after an organic thin-film layer is formed, a low temperature deposition process minimizes degradation of an electroluminescence (EL) layer due to heat or plasma. When the ITO or IZO is deposited at a lower temperature, film quality may become worse and specific resistance may become higher.

The cathode electrode is a common electrode, and the same voltage should be applied to all pixels arranged in a pixel portion. However, a voltage drop (namely, an IR drop) occurs due to the high specific resistance of the cathode electrode. This causes different voltage levels to be applied to the pixels in accordance with their arranged positions. Thus, when a cathode voltage is applied from an external terminal to the cathode electrode, pixels arranged near the external terminal and pixels spaced apart from the external terminal do not have the same voltage, which causes the voltage drop. This voltage difference per pixel position may cause non-uniformity of luminance and/or image quality.

In particular, the voltage drop problems may become more serious in a top-emitting organic light-emitting device of medium and large size. Korea Patent Application No. 2002-0057336 discloses a technique that uses a cathode bus line in the top-emitting structure. The cathode bus line is connected to an external terminal and contacts a cathode electrode, so that the cathode electrode is connected to the external terminal through the cathode bus line.

The method for connecting the cathode bus line to the cathode electrode may prevent the voltage drop of the cathode electrode with respect to the pixel position. However, when a carrier transporting layer, such as an organic layer, is formed on the entire surface of the substrate between the cathode bus line and the cathode electrode, the cathode bus line and the cathode electrode are not electrically coupled to with each other.

SUMMARY OF THE INVENTION

The present invention provides an organic light emitting device capable of performing entire surface deposition of a carrier transporting layer by electrically coupling a cathode bus line to a cathode electrode in a non-pixel region and method for fabricating the same.

The present invention further provides an organic light emitting device capable of connecting a cathode bus line to a cathode electrode per pixel in a pixel region by depositing a carrier transporting layer by means of a fine metal mask and method for fabricating the same.

The present invention also provides an organic light emitting device having a structure for connecting a cathode bus line to a cathode electrode suitable for the organic light emitting device of medium and large size and method for fabricating the same.

To achieve the above purpose, one aspect of the present invention provides a flat panel display, which comprises an insulating substrate having a pixel region and a non-pixel region, a first electrode arranged in the pixel region, a second electrode arranged in the pixel region and the non-pixel region, an organic emission layer and a charge transporting layer formed between the first electrode and the second electrode of the pixel region, and an electrode line formed over the pixel region and the non-pixel region of the insulating substrate, wherein the electrode line and the second electrode are electrically contacted with each other in the non-pixel region.

In addition, the present invention provides a method for fabricating a flat panel display, which comprises providing an insulating substrate having a pixel region and a non-pixel region, forming a first electrode on the pixel region of the insulating substrate, forming an organic emission layer and a charge transporting layer on the first electrode, forming an electrode line in the pixel region and the non-pixel region, forming a second electrode in the pixel region and the non-pixel region, wherein the electrode line and the second electrode are electrically contacted in the non-pixel region.

BRIEF DESCRIPTION OF THE DRAWINGS

The above and other features and advantages of the present invention will become more apparent to those of ordinary skill in the art by describing in detail preferred embodiments thereof with reference to the attached drawings.

FIGS. 1A and 1B illustrate plan views of an organic light emitting device in accordance with an embodiment of the present invention.

FIGS. 3A and 3B illustrate plan views of an organic light emitting device in accordance with an embodiment of the present invention.

DETAILED DESCRIPTION OF THE INVENTION

Figure 2:
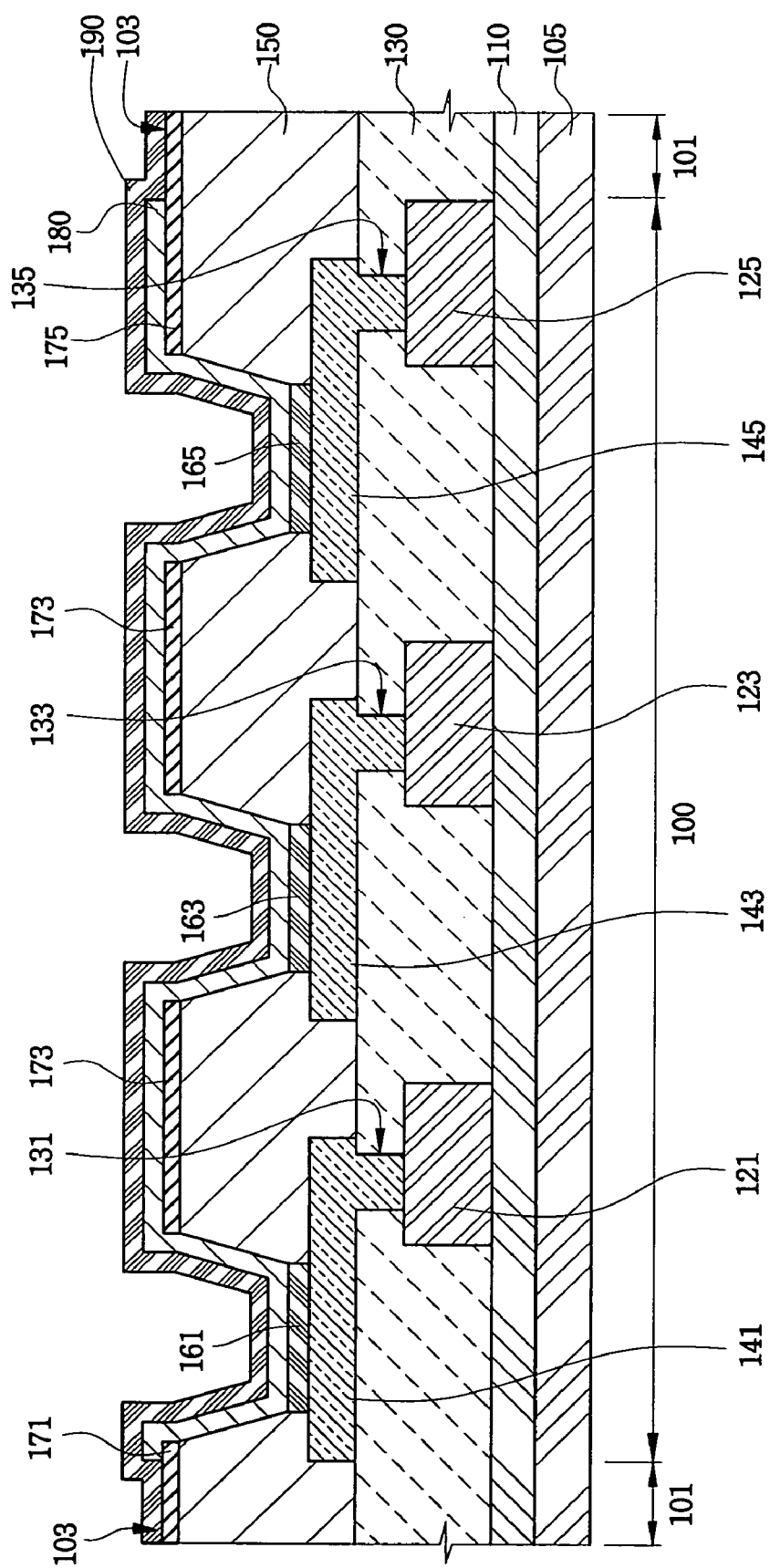
FIG. 2 illustrates a cross-sectional view of an organic light emitting device in accordance with an embodiment of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will more fully convey the scope of the invention to those skilled in the art. In the drawings, the thickness of layers and regions are exaggerated for clarity. Like numbers refer to like elements throughout the specification.

FIG. 1A illustrates a plan view of an organic light emitting device in accordance with an embodiment of the present invention.

Referring to FIG. 1A, a substrate has a pixel region 100, where pixels are arranged, and a non-pixel region 101. A cathode bus line 170 is formed at a peripheral portion of the pixel region 100, namely, the non-pixel region 101, so that the cathode bus line 170 and a cathode electrode 190 are electrically coupled to each other at a contact region 103 of the peripheral portion of the pixel region 100.

While FIG. 1A illustrates the cathode bus line 170 formed only in the non-pixel region 101, the cathode bus line 170 also may be formed to have a matrix or stripe shape in the pixel region 100 as illustrated in FIGS. 3A and 3B, or to have other shapes which allow the voltage drop to be prevented by supplying voltage to the pixels arranged in the pixel region 100.

FIG. 2 illustrates a cross-sectional view of an organic light emitting device taken along line II-II' of FIG. 1A, and, in particular, illustrates pixels arranged in the middle and edges of the pixel region 100.

Referring to FIG. 2, a buffer layer 110 is formed on an insulating substrate 105 comprised of the pixel region 100 and the non-pixel regions 101. Thin film transistors 121, 123, 125 are formed in the pixel region 100 of the insulating substrate 105. The thin film transistor 121 is arranged in the left most position of the pixel region 100, the thin film transistor 125 is arranged in the right most position of the pixel region 100, and the thin film transistor 123 is arranged for the pixel between the thin film transistor 121, 125 in the pixel region 100.

Anode electrodes 141, 143, 145 are formed on a passivation layer 130 and act as lower electrodes to be coupled to the thin film transistors 121, 123, 125 through via holes 131, 133, 135. The anode electrode 141 is arranged for the pixel in the left most position of the pixel region 100, the anode electrode 145 is arranged for the pixel in the right most position of the pixel region 100, and the anode electrode 143 is arranged for the pixel between the anode electrode 141 and anode electrode 145.

A pixel defining layer 150 is formed to expose some portions of the anode electrodes 141, 143, 145. Cathode bus lines 171, 173, 175 are formed on the pixel defining layer 150, and an organic thin-film layer is formed to include organic emission layers 161, 163, 165, for R, G, B, respectively, and a charge transporting layer 180. A cathode electrode 190, as an upper electrode, is deposited on the entire surface of the substrate, including the pixel region 100 and the non-pixel region 101.

The charge transporting layer 180 is a common layer for R, G, B, and is deposited on the entire surface of the pixel region 100 using, for example, an open mask. The charge transporting layer 180 may include at least one of a hole injecting layer, a hole transporting layer, a hole blocking layer, an electron transporting layer, or an electron injecting layer, which are not shown in the same figure.

R, G, B organic emission layers 161, 163, 165 are deposited on the exposed portions of the anode electrodes 141, 143, 145, respectively, using, for example, a fine metal mask. The organic emission layer 161 is arranged for the pixel in the left most position of the pixel region 100, the organic emission layer 165 is arranged for the pixel in the right most position of the pixel region 100, and the organic emission layer 163 is arranged for the pixel between organic emission layer 161 and organic emission layer 165.

The cathode bus line 171 is formed in the pixel region 100 and the non-pixel region 101, and is arranged in the left most position of the pixel region 100. The cathode bus line 175 is formed in the pixel region 100 and the non-pixel region 101, and is arranged in the right most position of the pixel region 100, and the cathode bus line 173 is arranged between the right most and left most positions of the pixel region 100.

The cathode bus lines 171 and 175, of the cathode bus line 170 arranged in the right most and left most positions of the pixel region, are extended to the contact region 103 of the non-pixel region 101, as well as to the pixel region 100. The cathode bus line 170 is formed along the peripheral portion of the pixel region 100 in the non-pixel region 101 to be electrically and directly coupled. The pixel region 100 has an emission region and a non-emission region. The emission region corresponds to the region where light is emitted from the organic emission layers 161, 163, 165, and the non-emission region corresponds to the pixel defining layer 150, namely the region except the emission region. Some portions of the cathode bus line 170 in the pixel region 100 are formed on the pixel defining layer 150, so that these portions of the cathode bus line are not electrically coupled with the cathode electrode 190 in the pixel region by the charge transporting layer 180 interposed therebetween.

The cathode bus line 170 may use a conductive material that absorbs light, such as, for example, a MIHL (metal insulator hybrid layer) thin-film layer having a concentration gradient of a transparent conductive layer and a metal layer, to act as an electrode as well as a black matrix for blocking light. The cathode bus line 170 may be a supplementary electrode of the cathode electrode, wherein a voltage, having the same polarity and the same level as that applied to the cathode electrode 190, is applied to the cathode bus line 170 to prevent the voltage drop through the cathode electrode.

FIG. 1B illustrates another plan view of an organic light emitting device in accordance with an embodiment of the present invention, wherein a cathode bus line 271 is formed only at one outer portion of a pixel region 200 in a non-pixel region 201. The cathode bus line 271 and a cathode electrode 290 are electrically and directly coupled to each other only at the outer portion of the pixel region 200. This differs from FIG. 1A in that the cathode bus line 170 is formed along the pixel region 100 in the non-pixel region 101, so that the cathode bus line 170 and the cathode electrode 190 are electrically and directly coupled to each other in all directions of the non-pixel region 100.

In accordance with an embodiment of the present invention, the cathode bus line is formed in at least one portion of the non-pixel region, so that the cathode bus line and the cathode electrode are electrically and directly coupled to each other through the contact region of the non-pixel region, even when the charge transporting layer is deposited on the entire surface of the pixel region using an open mask.

In addition to the structure connecting the cathode bus line to the cathode electrode, as shown in an embodiment of the present invention, the cathode bus line and the cathode electrode may be connected in the non-pixel region, which is the outer portion of the pixel region.

FIG. 3A illustrates a plan view of an organic light emitting device in accordance with an embodiment of the present invention.

Referring to FIG. 3A, a cathode bus line 370 is formed in a grid or matrix shape only in the pixel region 100, so that the cathode bus line 370 and a cathode electrode 390 are electrically and directly coupled to each other through a contact region 303 per each pixel.

Figure 4:
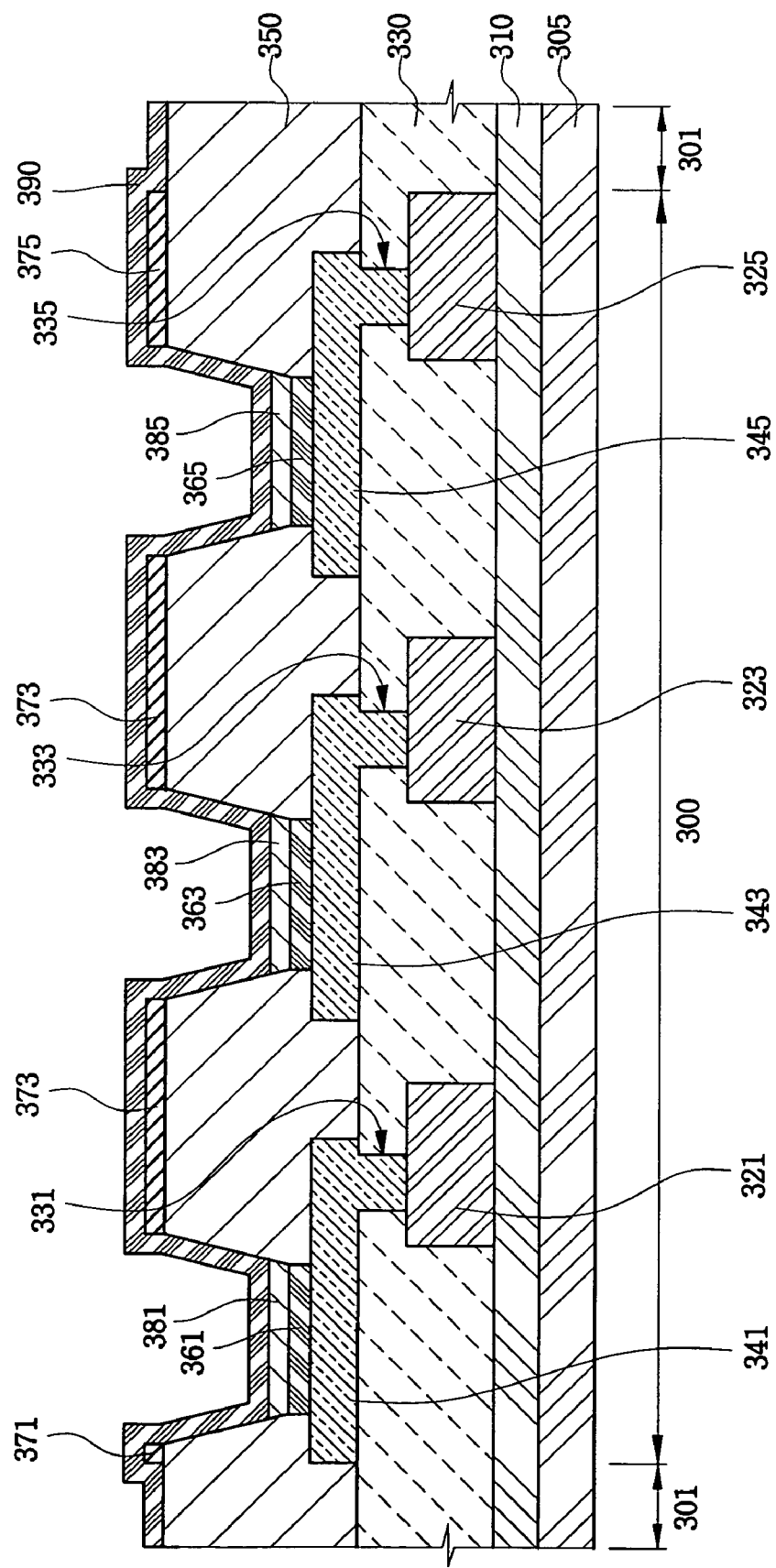
FIG. 4 illustrates a cross-sectional view of an organic light emitting device in accordance with an embodiment of the present invention.

FIG. 4 illustrates a cross-sectional view of the organic light emitting device taken along line IV-IV' of FIG. 3A, and, in particular, illustrates pixels arranged in the middle and edge portions of the pixel region 300.

Referring to FIG. 4, a buffer layer 310 is formed on an insulating substrate 305 comprised of a pixel region 300 and a non-pixel region 301. Thin film transistors 321, 323, 325 are formed in the pixel region 300 of the insulating substrate 305. The thin film transistor 321 is arranged for the pixel in the left most position of the pixel region 300, and the thin film transistor 325 is arranged in the right most position of the pixel region 300. The thin film transistor 323 is arranged, for the pixel between thin film transistor 321 and thin film transistor 325.

Anode electrodes 341, 343, 345 are formed on a passivation layer 330, and act as lower electrodes to be connected to the thin film transistors 321, 323, 325 through via holes 331, 333, 335, respectively. The anode electrode 341 is arranged for the pixel in the left most position of the pixel region 300, and the anode electrode 345 is arranged for the pixel in the right most position of the pixel region 300. The anode electrode 343 is arranged for the pixel between the anode electrode 341 and the anode electrode 345.

A pixel defining layer 350 is formed to expose some portions of the anode electrodes 341, 343, 345, and cathode bus lines 371, 373, 375 are formed on the pixel defining layer 350. Organic thin-film layers, including organic emission layers 361, 363, 365 for R, G, B and charge transporting layers 381, 383, 385 as an organic EL common layer, are selectively formed on the exposed portions of the anode electrodes 341, 343, 345, respectively, using, for example, a fine metal mask (not shown in the same figure), which correspond to an emission regions of the pixel region 300. The cathode electrode 390 is deposited on the entire surface of the substrate, including the pixel region 300 and the non-pixel region 301.

The organic emission layer 361 corresponds to the pixel arranged in the left most position of the pixel region 300, the organic emission layer 365 corresponds to the pixel arranged in the right most position of the pixel region 300, and the organic emission layer 363 corresponds to the pixel arranged between the right most and left most positions. The charge transporting layer 380 as a common layer for R, G, B, is deposited on only the organic emission layers using, for example a fine metal mask (not shown). In this case, the charge transporting layer 380 may include at least one of a hole injecting layer, a hole transporting layer, a hole blocking layer, an electron transporting layer and/or an electron injecting layer, which are not shown in the figure.

The cathode bus lines 371, 373, 375 are formed only in the pixel region 300. The cathode bus line 371 corresponds to the pixel arranged in the left most position of the pixel region 300, the cathode bus line 375 corresponds to the pixel arranged in the right most position of the pixel region 300, and the cathode bus line 373 corresponds to the pixel arranged between the right most and left most positions of the pixel region 300.

The cathode bus line 370 is formed to have a grid or matrix shape on the pixel defining layer 350 in the pixel region 300 as shown in FIG. 3A. The cathode bus line 370 may use a material that absorbs light and has conductivity, such as, for example, an MIHL thin-film layer having a concentration gradient of a transparent conductive layer and a metal layer to act as an electrode as well as a black matrix for blocking light. The cathode bus line 370 may act as a supplementary electrode of the cathode electrode 390, wherein a voltage having the same polarity and the same level as that applied to the cathode electrode 390 is applied to the cathode bus line 370 to prevent the voltage drop through the cathode electrode.

FIG. 3B illustrates a cross-sectional view of an organic light emitting device in accordance with an embodiment of the present invention. The cathode bus line 470 is a stripe shape, so that the cathode bus line 470 and the cathode electrode 490 are electrically and directly coupled to each other on a line basis in the pixel region 400. This is different from FIG. 3A in that the cathode bus line 370 is formed to have a grid shape in the pixel region 300 so that the cathode bus line 370 and the cathode electrode 390 are electrically and directly coupled in the pixel region 310 per each pixel.

According to an embodiment of the present invention, the cathode bus line 370 is a grid shape only in the pixel region 300, so that the charge transporting layers 381, 383, 385 are formed only on each of the anode electrodes 341, 343, 345 per each pixel. This may be formed using a fine metal mask, for example, and the cathode electrode 390 is formed on the entire surface of the substrate. The charge transporting layers 381, 383, 385 are partially formed only on the organic emission layers 361, 363, 365, so that the cathode bus line 370 and the cathode electrode 390 are electrically coupled to each other per each pixel in the pixel region 300.

In addition to the structure of the cathode bus line described in other embodiments of the present invention, other structures may be applied such that the cathode bus line is connected to the cathode electrode in the pixel region.

As mentioned above, the organic light emitting device in accordance with an exemplary embodiment of the present invention allow the cathode bus line to be formed only in the pixel region and, concurrently, charge transporting layers to be separated from one another for each pixel, so that the cathode bus line and the cathode electrode may be electrically coupled to each other in the pixel region. Further exemplary embodiments of the present invention allow the cathode bus line to be formed in the non-pixel region so that the cathode bus line and the cathode electrode may be electrically and directly coupled to each other at the outer portion of the pixel region. Therefore, the cathode electrode and the cathode bus line may be easily coupled to each other and, at the same time, the voltage drop of the cathode electrode per each pixel may be prevented.

While the present invention has been described with reference to particular embodiments, it is understood that the disclosure has been made for purpose of illustrating the invention by way of examples and is not limited to limit the scope of the invention. And one skilled in the art can make amend and change the present invention without departing from the scope and spirit of the invention.

What is claimed is:

1. A flat panel display, comprising:
   an insulating substrate having a pixel region and a non-pixel region;
   a first electrode arranged in the pixel region;
   a second electrode arranged in the pixel region and the non-pixel region;
   an organic emission layer and a charge transporting layer arranged between the first electrode and the second electrode; and
   an electrode line arranged on the insulating substrate,
   wherein the electrode line and the second electrode physically contact each other only in the non-pixel region, and
   wherein the electrode line supplies power from outside to the second electrode,
   wherein the pixel region includes an emission region where light is emitted from the organic emission layer, and a non-emission region, and
   wherein the electrode line is arranged in a portion of the non-emission region in the pixel region.

2. The flat panel display device of claim 1 wherein the electrode line arranged in the portion of the non-emission region is a material that absorbs external light and has conductivity.

3. The flat panel display device of claim 2, wherein the charge transporting layer is arranged between a portion of the electrode line and the second electrode.

4. The flat panel display device of claim 1, wherein a portion of the electrode line arranged in the pixel region have one of a stripe shape or a matrix shape.

5. The flat panel display device of claim 1, wherein the electrode line has a current with a voltage having the same polarity as the second electrode.

6. The flat panel display device of claim 1, wherein the electrode line is a supplementary electrode of the second electrode.

7. The flat panel display device of claim 1, wherein the electrode line is arranged in portion of the non-pixel region so that the electrode line is electrically coupled to the second electrode in the non-pixel region.

8. The flat panel display device of claim 7, wherein the electrode line is arranged along an outer periphery of the pixel region in the non-pixel region so that the electrode line is electrically coupled to the second electrode.

9. The flat panel display device of claim 7, wherein the electrode line is arranged in at least one outer side of the pixel region in the non-pixel region so that the electrode line is electrically coupled to the second electrode.

10. The flat panel display device of claim 1, wherein the organic emission layer is arranged only on the first electrode, and the charge transporting layer is arranged on substantially an entire surface of the substrate in the pixel region.

11. A flat panel display, comprising:
    an insulating substrate having a pixel region and a non-pixel region;
    a first electrode arranged in the pixel region;
    a second electrode arranged in the pixel region and the non-pixel region;
    an organic emission layer and a charge transporting layer arranged between the first electrode and the second electrode, the charge transporting layer being arranged on an entire surface of the substrate in the pixel region; and
    an electrode line arranged on the insulating substrate,
    wherein the charge transporting layer is arranged between the electrode line and the second electrode in the pixel region, and the electrode line and the second electrode physically contact each other in the non-pixel region, and
    wherein the electrode line supplies power from the outside to the second electrode.

12. The flat panel display device of claim 11,
    wherein the pixel region includes an emission region where light is emitted from the organic emission layer, and a non-emission region, and
    wherein the electrode line is arranged in a portion of the non-emission region in the pixel region.

13. The flat panel display device of claim 12, wherein the electrode line arranged in the portion of the non-emission region is a material that absorbs external light and has conductivity.

14. The flat panel display device of claim 13, wherein the charge transporting layer is arranged between a portion of the second electrode and the organic emission layer.

15. The flat panel display device of claim 11, wherein a portion of the electrode line arranged in the pixel region has one of a stripe shape or a matrix shape.

16. The flat panel display device of claim 11, wherein the electrode line has a current with a voltage having the same polarity as the second electrode.

17. The flat panel display device of claim 11, wherein the electrode line is a supplementary electrode of the second electrode.

* * * * *